United States Patent
Ihm (12)

(10) Patent No.: US 6,199,085 B1
(45) Date of Patent: Mar. 6, 2001

(54) DIFFERENTIATOR IN COMB FILTER

(75) Inventor: Jae Yong Ihm, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/143,352

(22) Filed: Aug. 28, 1998

(30) Foreign Application Priority Data

Mar. 5, 1998 (KR) .................................... 98-7297

(51) Int. Cl.[7] ................ G06F 17/10; G06F 7/38
(52) U.S. Cl. ............................ 708/316; 708/490
(58) Field of Search .................. 708/300–323, 708/523, 490

(56) References Cited

U.S. PATENT DOCUMENTS

| | | | |
|---|---|---|---|
| 4,215,416 | * 7/1980 | Miramatsu | 708/523 |
| 4,701,956 | * 10/1987 | Katoh | 708/316 |
| 4,949,292 | * 8/1990 | Hoshino et al. | 708/520 |
| 5,451,952 | 9/1995 | Yamazaki et al. | 341/158 |
| 5,506,798 | * 4/1996 | Shimada et al. | 708/316 |
| 5,831,879 | * 11/1998 | Yom et al. | 708/316 |

OTHER PUBLICATIONS

B.P. Brandt et al., "A Low–Power, Area–Efficient Digital Filter for Decimation and Interpolation," IEEE Journal of Solid–State Circuits, vol. 29, No. 6, Jun. 1994 pp. 679–687.

* cited by examiner

*Primary Examiner*—Tan V. Mai
(74) *Attorney, Agent, or Firm*—Fleshner & Kim, LLP

(57) ABSTRACT

A differentiator in a comb filter is provided having a reduced size and an increased operating speed. The differentiator can include a first delay for receiving and delaying a signal in a number of steps corresponding to a number of stages. The first delay selectively forwards a plurality of delayed signals corresponding to the number of stages. A selector receives the delayed signals from the first delay, and selectively forwards one of the delayed signals. An operator logically processes a signal from the selector and a feed-back signal in response to an external control signal. A second delay receives, delays and forwards a signal from the operator, and a logic circuit subjects a signal from the second delay to a logical operation and feeds back an output to a reception terminal on the operator.

17 Claims, 5 Drawing Sheets

FIG.6

|  | | Address | Add_Sub |
|---|---|---|---|
| $T_1$ : $0 - x(n-5)$ | | e | 0 |
| $T_2$ : $-x(n-5)-x(n-1)$ | | b | 0 |
| $T_3$ : $-x(n-5)-x(n-1)-x(n-1)$ | | b | 0 |
| ⋮ | | ⋮ | ⋮ |
| $T_6$ : $-x(n-5)-5x(n-1)$ | | b | ⋮ |
| $T_7$ : $-x(n-5)-5x(n-1)-x(n-3)$ | | d | ⋮ |
| $T_8$ : $-x(n-5)-5x(n-1)-x(n-3)-x(n-3)$ | | d | ⋮ |
| ⋮ | | ⋮ | ⋮ |
| $T_{16}$ : $-x(n-5)-5x(n-1)-10x(n-3)$ | | d | 0 |
| $T_{17}$ : $-x(n-5)-5x(n-1)-10x(n-3)+x(n-2)$ | | c | 1 |
| $T_{18}$ : $-x(n-5)-5x(n-1)-10x(n-3)+x(n-2)+x(n-2)$ | | c | 1 |
| ⋮ | | ⋮ | ⋮ |
| $T_{26}$ : $-x(n-5)-5x(n-1)-10x(n-3)+10x(n-2)$ | | c | ⋮ |
| $T_{27}$ : $-x(n-5)-5x(n-1)-10x(n-3)+10x(n-2)+x(n-4)$ | | e | ⋮ |
| $T_{28}$ : $-x(n-5)-5x(n-1)-10x(n-3)+10x(n-2)+x(n-4)+x(n-4)$ | | e | ⋮ |
| ⋮ | | ⋮ | ⋮ |
| $T_{31}$ : $-x(n-5)-5x(n-1)-10x(n-3)+10x(n-2)+5x(n-4)$ | | e | ⋮ |
| $T_{32}$ : $-x(n-5)-5x(n-1)-10x(n-3)+10x(n-2)+5x(n-4)+x(n)$ | | a | 1 |

DIFFERENTIATOR IN COMB FILTER

BACKGROUND OF THE INVENTION

1. Field of the Invention

The present invention relates to a filter, and more particularly, to a reduced size comb filter.

2. Background of the Related Art

In general, a comb filter is provided with a differentiator and an integrator. If it is assumed that a down sampling ratio is "M" and a stage number is "N", a transmission function "H(Z)" of the comb filter may be expressed as follows.

$$H(Z) = \frac{Y(Z)}{X(Z)} = \left(\frac{1-Z^{-M}}{1-Z^{-1}}\right)^N = \frac{(1-Z^{-M})^N \leftarrow \text{Differentiator}}{(1-Z^{-1})^N \leftarrow \text{Integrator}}$$

Thus, there is a differentiator and an integrator in a comb filter, and the present invention is related to the differentiator. A background art differentiator in a comb filter will now be described. FIG. 1 illustrates a hardware system of the background art differentiator having a down sampling ratio M="1" and a stage number N="5".

In the above transmission function, the differentiator transmission function is $(1-Z^{-M})^N$. If a down sampling is "1"(M=1) and a number of stages is "5"(N=5), the differentiator transmission function will be $(1-Z^{-1})^5$, which may be expressed by equation (1) as follows.

$$(1-Z^{-1})^5 = 1 - 5Z^{-1} + 10Z^{-2} - 10Z^{-3} + 5Z^{-4} - Z^{-5} \quad (1)$$

A hardware system of the background art differentiator for implementing the differentiator transmission function of equation (1) is as shown in FIG. 1. The background art differentiator is provided with five subtractors 1 to 5 and five flipflops 6 to 10. A first flipflop 6 is for receiving and delaying a signal X(n), and a first subtractor 1 is for subtracting a signal delayed by the first flipflop 6 from the signal X(n). A second flipflop 7 is for receiving and delaying a signal from the first subtractor 1, and a second subtractor 2 is for subtracting a signal from the second flipflop 7 from the signal from the first subtractor 1. A third flipflop 8 receives and delays a signal from the second subtractor 2, and a third subtractor 3 subtracts a signal from the third flipflop 8 from the signal from the second subtractor 2. A fourth flipflop 9 is for receiving and delaying a signal from the third subtractor 3, and a fourth subtractor 4 for subtracting a signal from the fourth flipflop 9 from the signal from the third subtractor 3. A fifth flipflop 10 is for receiving and delaying a signal from the fourth subtractor 4, and a fifth subtractor 5 is for subtracting a signal from the fifth flipflop 10 from the signal from the fourth subtractor 4. When a master clock of the comb filter is 1/128 fs, a CLK-DIFF clock of ¼ fs is applied to clock terminals on the flops 6–10.

The operation of the background art comb filter differentiator will now be described. FIG. 2 illustrates a timing diagram of a clock signal of the differentiator shown in FIG. 1.

Referring to FIG. 2, when the background art comb filter system has a master clock of 128 fs, a cycle Tm of the master clock is 1/128 fs and a cycle Tc of the CLK-DIFF is ¼ fs. The signal X(n) is received in the order D1, D2, D3, D4, —with intervals of ¼ fs. Since each subtractor conducts a subtraction only when the CLK-DIFF signal is received, the subtraction occurs in intervals of T1–T2, T33–T34 and the like. FIG. 3 illustrates a data flow in the background art differentiator. The differentiator forwards signals Y(n) at ¼ fs intervals as shown in FIG. 3.

As described above, the background art comb filter differentiator has various problems. While a time period required for calculating one data is T1–T2 in the background art differentiator in a comb filter, all subtractors are idle in the rest of the time period T3–T33. Accordingly, the background art comb filter differentiator has a low efficiency. Further, one subtractor per stage is provided, which increases device size and costs.

The above references are incorporated by reference herein where appropriate for appropriate teachings of additional or alternative details, features and/or technical background.

SUMMARY OF THE INVENTION

An object of the present invention is to provide a differentiator in a comb filter that substantially obviates one or more of the problems caused by limitations and disadvantages of the related art.

Another object of the present invention is to provide a differentiator in a comb filter, which has a reduced hardware.

Another object of the present invention is to provide a differentiator in a comb filter that has a reduced cost.

Another object of the present invention is to provide a differentiator in a comb filter that has a reduced size.

Another object of the present invention is to provide a differentiator in a comb filter that has an increased efficiency.

To achieve at least these objects and other advantages in a whole or in parts and in accordance with the purpose of the present invention, as embodied and broadly described, the differentiator in a low pass filter includes a first delay circuit that receives a clock signal and an input signal and repeatedly delays the input signal to generate a plurality of delayed signals, a selection circuit that receives the delayed signals from the first delay and outputs a selected delayed signal of the delayed signals and a resettable accumulator that receives the selected signal from the selection circuit and outputs a value.

To further achieve these objects and other advantages in a whole or in parts and in accordance with the purpose of the present invention, as embodied and broadly described, a differentiator in a comb filter includes a first delay that receives an input signal and repeatedly delays the input signal to generate a plurality of delayed signals, a selector that receives the delayed signals from the first delay and outputs a selected delayed signal of the delayed signals, an operator that subjects the selected signal and a feed-back signal to processing in response to a control signal, a second delay that receives a clock signal and an output signal from the operator and outputs an accumulated signal and a logic-gate that logically processes an output from the second delay and outputs the feed-back signal to the operator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 6 is a diagram that illustrates operation sequence and control signals of the differentiator of FIG. 4.

DETAILED DESCRIPTION OF PREFERRED EMBODIMENTS

Figure 1:
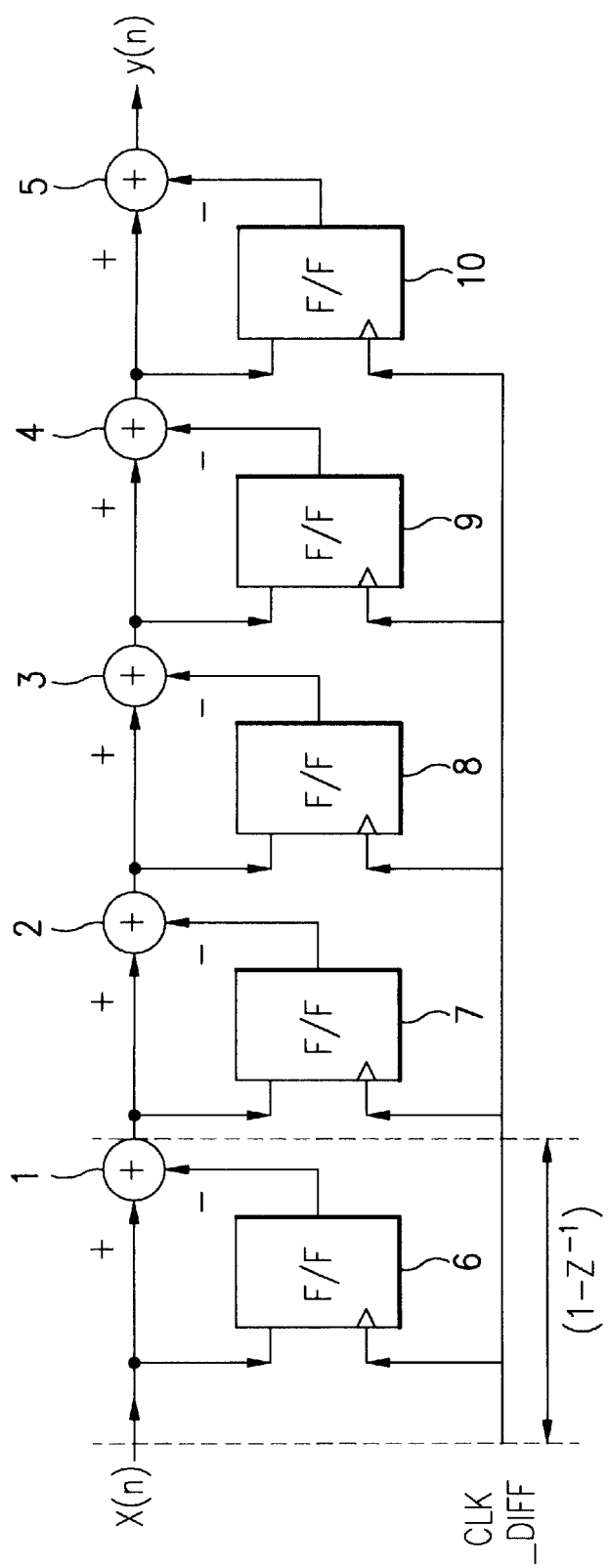
FIG. 1 is a diagram that illustrates a background art differentiator.
Figure 2:
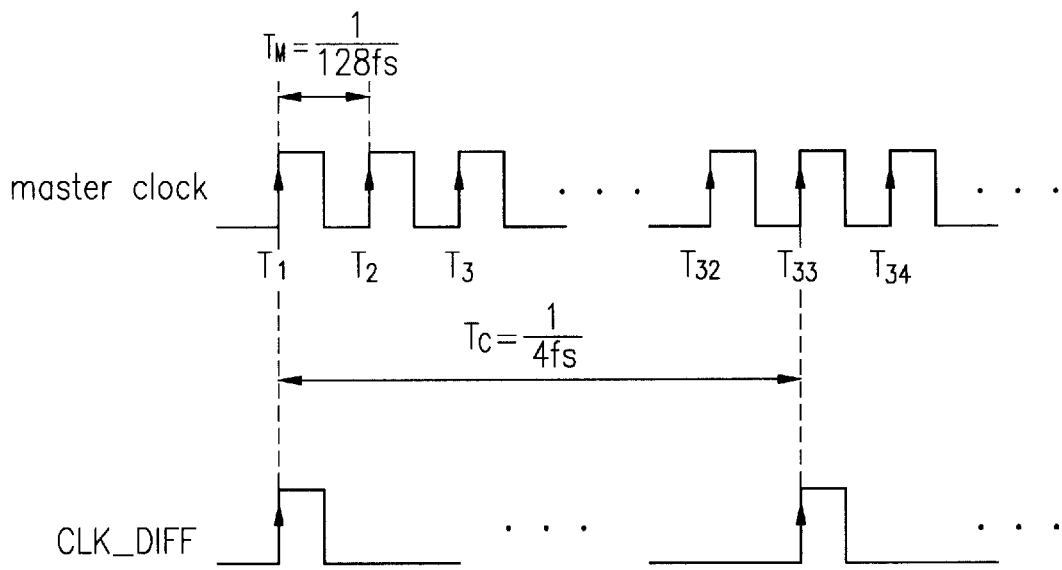
FIG. 2 is a diagram that illustrates clock signal timing of the differentiator of FIG. 1.
Figure 3:
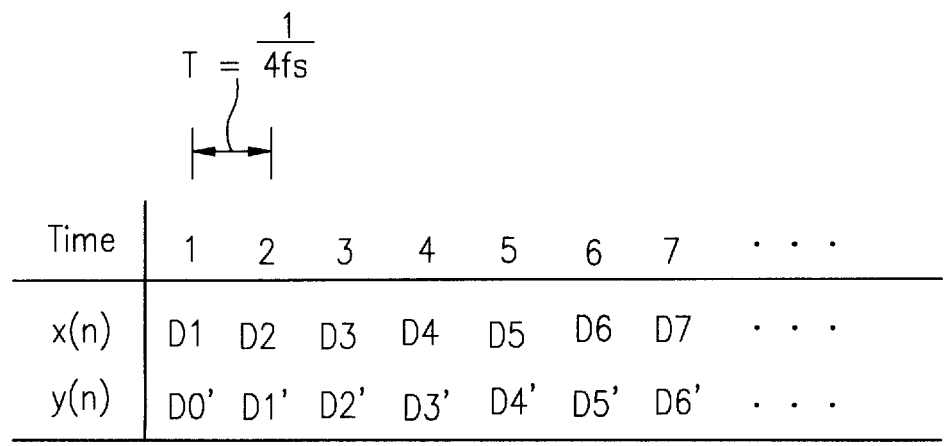
FIG. 3 a diagram that illustrates a data flow in the differentiator of FIG. 1.
Figure 4:
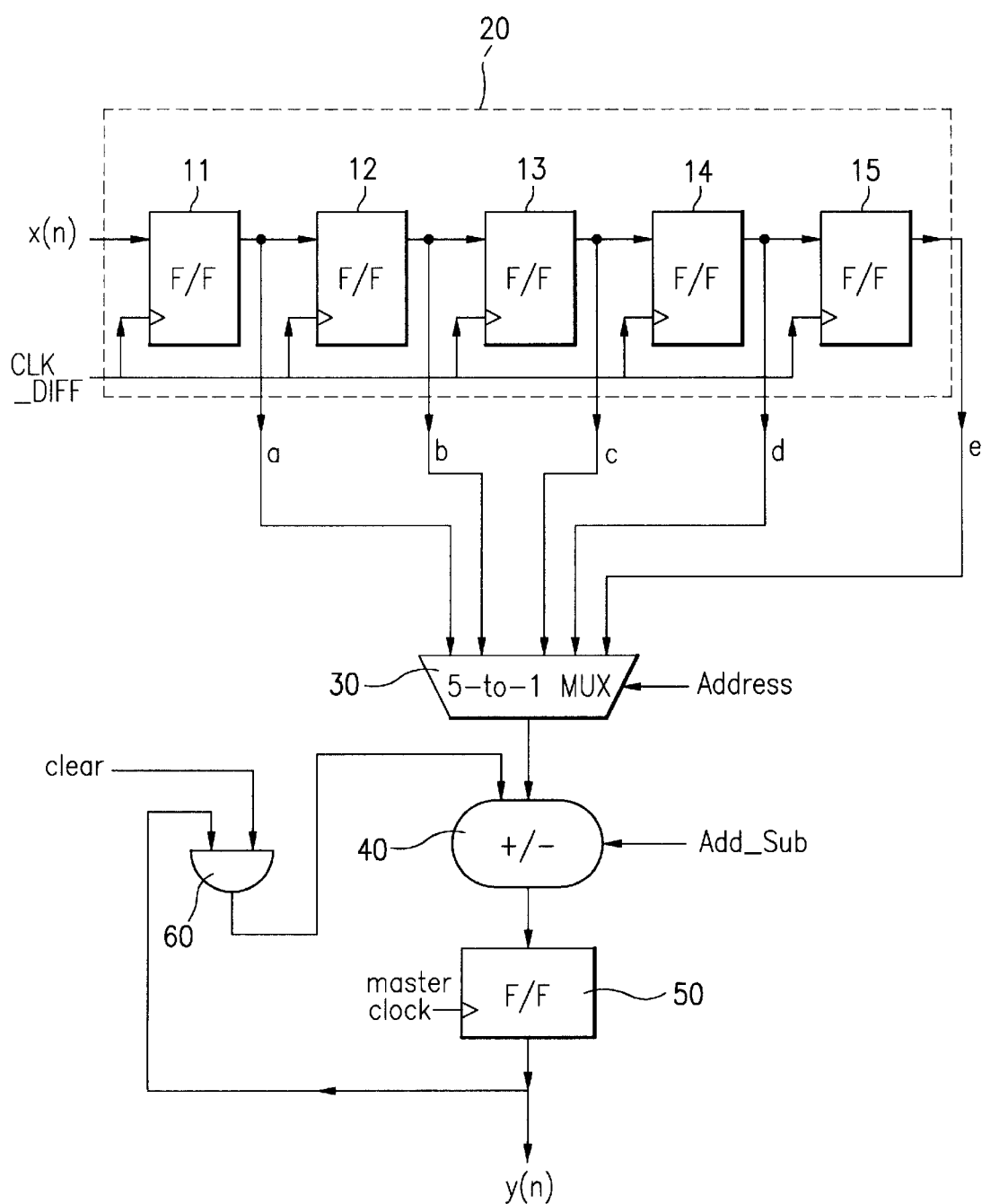
FIG. 4 is a diagram that illustrates a differentiator in accordance with a preferred embodiment of the present invention.

FIG. 4 is a diagram that illustrates a circuit of a first preferred embodiment of a differentiator in a comb filter in accordance with the present invention. Shown in FIG. 4 is a hardware system of the first preferred embodiment comb filter differentiator where a down sampling number M equals "1" and a stage number N equals "5".

Referring to FIG. 4, the differentiator in a comb filter in accordance with the first preferred embodiment of the present invention includes a first delay 20 having five flipflops 11~15 for receiving and delaying a signal X(n) in five stages and forwarding a delayed signal from a preceding stage whenever delayed. A selector 30 selects one signal from multiple signals (e.g., five) output from the first delay 20 in response to an external control signal (e.g., address). An operator 40 subjects a signal from the selector 30 and a feed-back signal to addition or subtraction in response to an external control signal. A second delay 50 delays a signal from the operator 40, and an AND gate 60 subjects an output signal from the second delay 50 to an ANDing operation and feeds back an output signal to a reception terminal on the operator 40.

Preferably, the number of flipflops 11~15 provided in the first delay 20 equals the number of stages in the differentiator, and a CLK-DIFF clock signal is applied to a clock terminal on each of the flipflops 11~15. The selector 30 includes a multiplexer MUX for providing one signal from a plurality of signals in response to an external control signal (address). As shown in FIG. 4, for example, the multiplexer MUX is a 5- to-1 multiplexer. The second delay 50 includes a flipflop F/F that receives a master clock signal as a clock signal, and the AND gate 60 has one AND gate for subjecting the output signal from the second delay 50 and an external clear signal to a logical operation.

Figure 5:
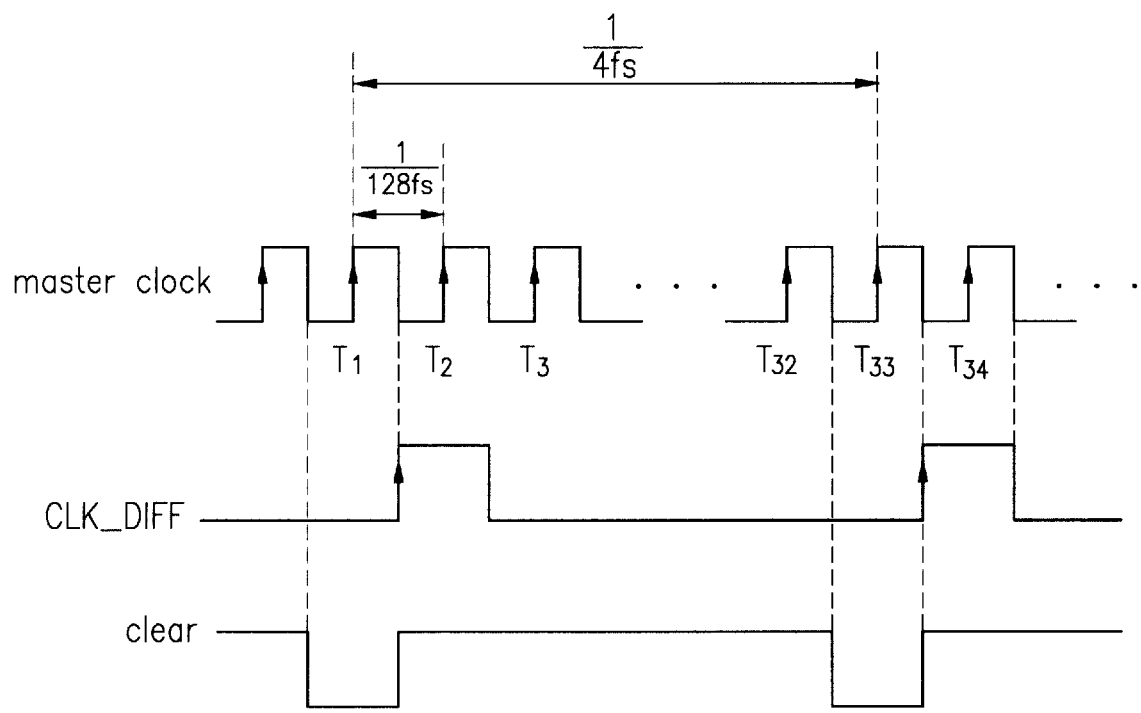
FIG. 5 is a diagram that illustrates signal timing for the differentiator of FIG. 4.

Operations of the differentiator in a comb filter in accordance with the first preferred embodiment of the present invention will now be described. FIG. 5 is a diagram that illustrates a master clock signal, a CLK-DIFF signal and a clear signal of the first preferred embodiment of the differentiator. FIG. 6 is a diagram that illustrates an operation sequence and control signals of the first preferred embodiment of a differentiator in a comb filter.

When a sampling number M is "1" and a number of stages N is "5", a transmission function of a differentiator of a comb filter can be expressed in the above-described equation (1).

$$(1-Z^{-1})^5 = 1 - 5Z^{-1} + 10Z^{-2} - 10Z^{-3} + 5Z^{-4} - Z^{-5} \quad (1)$$

Accordingly, an output Y(n) will be expressed by equation (2) as follows.

$$Y(n) = X(n) - 5X(n-1) + 10X(n-2) - 10X(n-3) + 5X(n-4) - X(n-5) \quad (2)$$

In accordance with the first preferred embodiment, the above operation can be done within 4 fs time period using the master clock of 128 fs. Further, the operation can be done with only one operator according to the first preferred embodiment of the present invention as shown in FIG. 5. The equation (2) may be rearranged and expressed by equation (3) as follows.

$$Y(n) = -X(n-5) - 5X(n-1) - 10X(n-3) + 10X(n-2) + 5X(n-4) + X(n) \quad (3)$$

The equation (3) means that the differentiator transmission function where M=1 and N=5 requires one time of −X(n−5) operation, five times of −X(n−1) operation for −5X(n−1) operation, ten times of −X(n−3) operation for −10X(n−3) operation, ten times of +X(n−2) operation for +10X(n−2) operation, five times of +X(n−4) for +5X(n−4) operation and one time of X(n) operation. An exemplary operation sequence of the equation (3) for the circuit of the first preferred embodiment that is synchronous to the master clock and the corresponding control signals are shown in FIG. 6. As shown in FIG. 4, under a state in which the last flipflop 15 provides X(n−5), an address signal "e" is provided to the multiplexer 30 so that the multiplexer 30 selects and forwards the function X(n−5). Further, a subtraction signal Sub is provided to the operator 40 so that the operator 40 makes an operation of −X(n−5).

As described above, the differentiator in a comb filter of the first preferred embodiment of the present invention has various advantages. The background art differentiator of a comb filter required a hardware system that included subtractors and flipflops, each respectively equal to the number of stages. Since the hardware requirements of the preferred embodiment reduces the number of subtractors to one while adding only one multiplexer and one flipflop, the present invention can reduce the circuit (e.g., hardware size) by approximately 30%. Further, the differentiator transmission function can be completed in a reduced time.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A differentiator in a low pass filter, comprising:
   a first delay circuit that receives an input signal and repeatedly delays the input signal to generate a plurality of delayed signals; and
   a differential operator that performs a differential operation on the delayed signals to transmit an output value, wherein the differential operator comprises:
   a selection circuit that receives the delayed signals from the first delay and outputs a selected delayed signal of the delayed signals;
   a logical operator that receives the selected delay signal and upon receipt of a feedback signal performs one of adding and subtracting the selected delay signal thereto;
   an accumulator circuit that receives an output signal from the logical operator and a clock signal to output an accumulated signal responsive to the clock signal, wherein responsive to a prescribed number of the clock signals and the prescribed number of the selected delay signals, the accumulated signal of the accumulator circuit is equal to the output value.

2. The differentiator of claim 1, wherein the plurality of delayed signals is equal in number to a prescribed number of stages in the differentiator.

3. The differentiator of claim 2, wherein the first delay circuit comprises the prescribed number of flipflops that each receive a first clock signal, wherein the output value is outputted in one cycle of the first clock signal.

4. The differentiator of claim 1, wherein the selection circuit selects the selected delay signal based on an address signal.

5. The differentiator in a of claim 1, wherein the selection circuit comprises a multiplexer.

6. The differentiator of claim 1, further comprising:
a logic-gate that logically processes the accumulated signal from the accumulator circuit and a clear signal and outputs the feedback signal to the logical operator, wherein the clear signal is enabled once for every prescribed number of the clock signals.

7. The differentiator of claim 6, wherein the logic-gate is an AND-gate.

8. The differentiator of claim 1, wherein the accumulator circuit receives a master clock, the first delay circuit receives an interval clock signal, and wherein the output value is an accumulated transmission function outputted once every interval clock signal period.

9. The differentiator of claim 8, wherein the differential operator does not include a coefficient generator.

10. A differentiator in a comb filter that receives an input signal and generates a differential output function based on the input signal, comprising:
a first delay that receives the input signal and repeatedly delays the input signal to generate a plurality of delayed signals;
a selector that receives the delayed signals from the first delay and outputs a selected delayed signal of the delayed signals;
an operator that subjects the selected signal and a feed-back signal to processing in response to a control signal;
a second delay that receives a clock signal and an output signal from the operator and outputs an accumulated signal responsive to each of the clock signals; and
a logic-gate that logically processes the accumulated signal from the second delay and outputs the feed-back signal to the operator, wherein the accumulated signal responsive to a prescribed number of the clock signals is equal to the differential output function.

11. The differentiator of claim 10, wherein the first delay includes a plurality of flipflops corresponding to a number of stages, and wherein an interval clock signal is input to each of the flipflops.

12. The differentiator of claim 11, wherein the clock signal has a frequency of $128*f_s$, where $f_s$ is a sampling frequency, and an interval clock frequency is $4*f_s$, and wherein the accumulated signal is output once every cycle of the interval clock.

13. The differentiator of claim 10, wherein the selector includes a multiplexer for receiving the plurality of delayed signals and forwarding the selected signal in response to an address signal.

14. The differentiator of claim 10, wherein the second delay includes a flipflop that receives a master clock signal as the clock signal.

15. The differentiator of claim 10, wherein the logic-gate is an AND-gate that subjects the output from the second delay and an external clear signal to an AND operation.

16. The differentiator of claim 10, wherein the operator subjects the selected signal and the feed-back signal to one of addition and subtraction.

17. A differentiator in a comb filter that receives an input signal and generates an output function based on the input signal, consisting of:
a first delay that receives the input signal and repeatedly delays the input signal to generate a plurality of delayed signals;
a selector that receives the delayed signals from the first delay and outputs a selected delayed signal of the delayed signals;
an operator that subjects the selected signal and a feed-back signal to processing in response to a control signal;
a second delay that receives a clock signal and an output signal from the operator and outputs an accumulated signal responsive to each of the clock signals; and
a logic-gate that logically processes the accumulated signal from the second delay and outputs the feed-back signal to the operator, wherein the accumulated signal responsive to a prescribed number of the clock signals is equal to the output function.

* * * * *